United States Patent [19]
Taguchi et al.

[11] Patent Number: 5,015,327
[45] Date of Patent: * May 14, 1991

[54] METHOD FOR PRODUCING SEMICONDUCTIVE SINGLE CRYSTAL

[75] Inventors: Tsunemasa Taguchi, Suita; Hirokuni Nanba, Osaka, both of Japan

[73] Assignees: Production Engineering Association of Shin-Osaka; Sumitomo Electric Industries, Inc., both of Osaka, Japan

[*] Notice: The portion of the term of this patent subsequent to Sep. 12, 2006 has been disclaimed.

[21] Appl. No.: 323,029

[22] Filed: Mar. 14, 1989

[30] Foreign Application Priority Data

Mar. 14, 1988 [JP] Japan .................... 63-59786

[51] Int. Cl.⁵ .................... C30G 1/08; C30G 1/10; C30G 23/02; C30G 29/48
[52] U.S. Cl. .................... 156/603; 156/610; 156/612; 156/613; 156/DIG. 72; 156/DIG. 77
[58] Field of Search ............ 156/603, 610, 612, 613, 156/614, DIG. 77, DIG. 72, DIG. 73

[56] References Cited

U.S. PATENT DOCUMENTS

| | | | |
|---|---|---|---|
| 4,422,888 | 12/1983 | Stutius | 156/613 |
| 4,584,053 | 4/1986 | Namba et al. | 156/DIG. 73 |
| 4,632,711 | 12/1986 | Fujita et al. | 148/175 |
| 4,866,007 | 9/1989 | Taguchi et al. | 437/108 |

FOREIGN PATENT DOCUMENTS 0282998 9/1988 European Pat. Off. .

OTHER PUBLICATIONS

Journal of Crystal Growth, B. V. Amsterdam, "Growth of High-Quality ZnSe by MOVPE on (100) ZnSe Substrate" Jan. 1, 1988, pp. 273-278.

*Primary Examiner*—Gary P. Straub
*Attorney, Agent, or Firm*—Cushman, Darby and Cushman

[57] ABSTRACT

A ZnSe thin film with good quality is homoepitaxially grown on a ZnSe single crystal substrate which is produced by the Recrystallization Traveling Heater Method.

6 Claims, 3 Drawing Sheets

5,015,327

METHOD FOR PRODUCING SEMICONDUCTIVE SINGLE CRYSTAL

BACKGROUND OF THE INVENTION

1. Field of the Invention

The present invention relates to a method for producing a semiconductive single crystal. More particularly, the present invention relates to a method for epitaxially growing a thin film of ZnSe single crystal on a ZnSe substrate by the MOCVD method.

2. Description of the Related Art

ZnSe is one of the II/VI group compound semiconductors and one of the promising materials of blue light emitting diodes.

Hitherto, no practically usable blue light emitting diode has been produced, since there has not been produced a suitable material which has a band gap of 2.5 eV or larger, from which a large area substrate crystal can be made, with which a p-n junction can be formed and the band gap of which is the direct transition type.

Although GaN, SiC, ZnSe, ZnS, GaAlN, ZnSSe and the like have the band gap of 2.5 eV or larger, their production techniques have not been developed to such extent that the blue light emitting diode could be produced from them. Concerning the ZnSe substrate, it has been difficult to produce a substrate with high purity and low crystalline defects.

To produce an LED, a p-n junction should be formed. To this end, a p-type thin film should be formed on a n-type substrate with low resistance, or a n-type thin film should be formed on a p-type substrate with low resistance. In case of ZnSe, if a thin film of non-doped ZnSe were formed on the ZnSe single crystal substrate, the ZnSe thin film could be converted to the n-type layer by ion implantation.

To produce the LED from ZnSe, ZnSe should be epitaxially grown on the substrate. However, no bulk single crystal with good quality has been provided. Then, the ZnSe thin layer has been grown on a GaAs substrate or a Ge substrate by the MOCVD or MBE method, since such substrates can be produced with high purity and with few defects.

The epitaxial growth of ZnSe on GaAs is disclosed in many literatures, for example, W. Stutius, Appl. Phys. Lett., Vol. 38 (1981) 352 and K. Ohkawa et al, J. Appl. Phys., Vol. 62 (1987) 3216.

However, since the growth of ZnSe on the GaAs substrate is heteroepitaxy, the lattice constant is different between the ZnSe thin film and the GaAs substrate. That is, there is a mismatching of the lattice constant. Since there is a big difference in thermal expansion between room temperature and the growth temperature, large stress is generated in the thin film, which results in the formation of defects. In addition, impurities diffuse from the substrate into the formed ZnSe thin film, whereby electrical characteristics of the thin film are modified. These are the inherent drawbacks of the heteroepitaxy, and it is hardly possible to overcome these drawbacks even if the epitaxy growth is done as completely as possible. Thus, the ZnSe thin film should be homoepitaxially grown on the ZnSe substrate.

Only one paper, namely P. Blanconnier et al, J. Appl. Phys. Vol. 52, No. 11 (1981) 6895 reported the homoepitaxial growth of the ZnSe thin film on the ZnSe substrate. Blanconnier et al grew the ZnSe thin film by the MOCVD method on the (110) plane of the ZnSe substrate produced by the iodine transporting method or the Piper method.

Many proposals have been made on the growth of the ZnSe single crystal ingot. However, each of them has its own drawbacks. Since the characteristics of the substrate will have influences on the epitaxially grown thin film, the method for producing the ZnSe single crystal substrate should be taken into consideration in the growth of the ZnSe thin film on the substrate.

Though the details of the method are not clear, Blanconnier et al grew the ZnSe thin film under the following conditions:

ZnSe substrate: (110) plane of the single crystal produced by the Piper method or the ion transporting method
Zn source: Diethylzinc [$Zn(C_2H_5)_2$]
Se source: $H_2Se$
Substrate temp. 500° C.
Growth rate 100 Å/min.
Thickness: 1-2 μm
Dislocation density in the epitaxial film: $10^6/cm^2$ On measuring such thin film with the photoluminescence (4.2 K.), strong emission spectrum due to excitons constrained with neutral donors appeared.

The ZnSe thin film grown on the substrate produced by the Piper method contains Ga as the impurity, which might be contained in dimethylzinc. The ZnSe thin film grown on the substrate produced by the iodine transporting method contains iodine atoms as the impurity, which might migrate from the substrate since the substrate contains the iodine atoms.

Blanconnier et al reported that many hillocks were present on the surface of the epitaxially grown thin film by the observation with a scanning type electron microscope. Such hillocks are assumed to be defects caused by the dislocation in the substrate.

SUMMARY OF THE INVENTION

One object of the present invention is to provide a method for epitaxially growing a ZnSe thin film on a ZnSe single crystal substrate with good quality.

Another object of the present invention is to provide a method for producing an epitaxially grown ZnSe thin film on a ZnSe substrate with good reproducibility, in which method, the grown film contains less impurities which migrates from the substrate.

Accordingly, the present invention provides a method for growing a ZnSe thin film on a ZnSe single crystal substrate, which comprises steps of: placing a piece of a ZnSe polycrystal in a sealed reactor tube having an atmosphere of at least one gas selected from the group consisting of an inert gas, nitrogen and $H_2Se$ kept at pressure of from 0.1 Torr. to 100 Torr., moving the reactor tube containing the piece of ZnSe polycrystal through a low temperature first zone kept at a temperature of from room temperature to 100° C., a temperature-raising second zone having a temperature gradient of from 50° C./cm to 200° C./cm, a high temperature third zone kept at a temperature of from 700° C. to 900° C., a temperature-lowering fourth zone having a temperature gradient of from −200° C./cm to −50° C./cm and a low temperature fifth zone kept at a temperature of from room temperature to 100° C. in this order at a moving rate of from 0.05 mm/day to 5 mm/day while keeping the solid state of the ZnSe crystal whereby the ZnSe polycrystal is converted to a ZnSe single crystal, cutting the ZnSe single crystal to form a ZnSe single crystal substrate, heating the ZnSe single crystal substrate in a hydrogen atmosphere under a pressure of from 0.1 Torr. to 10 Torr. at a temperature of from 250° C. to 450° C. while supplying a gaseous organozinc compound and $H_2Se$ gas in such amounts that a molar ratio of Se/Zn is from 10 to 100 to grow the ZnSe thin film on the surface of the ZnSe single crystal substrate.

DETAILED DESCRIPTION OF THE DRAWINGS

Figure 1:
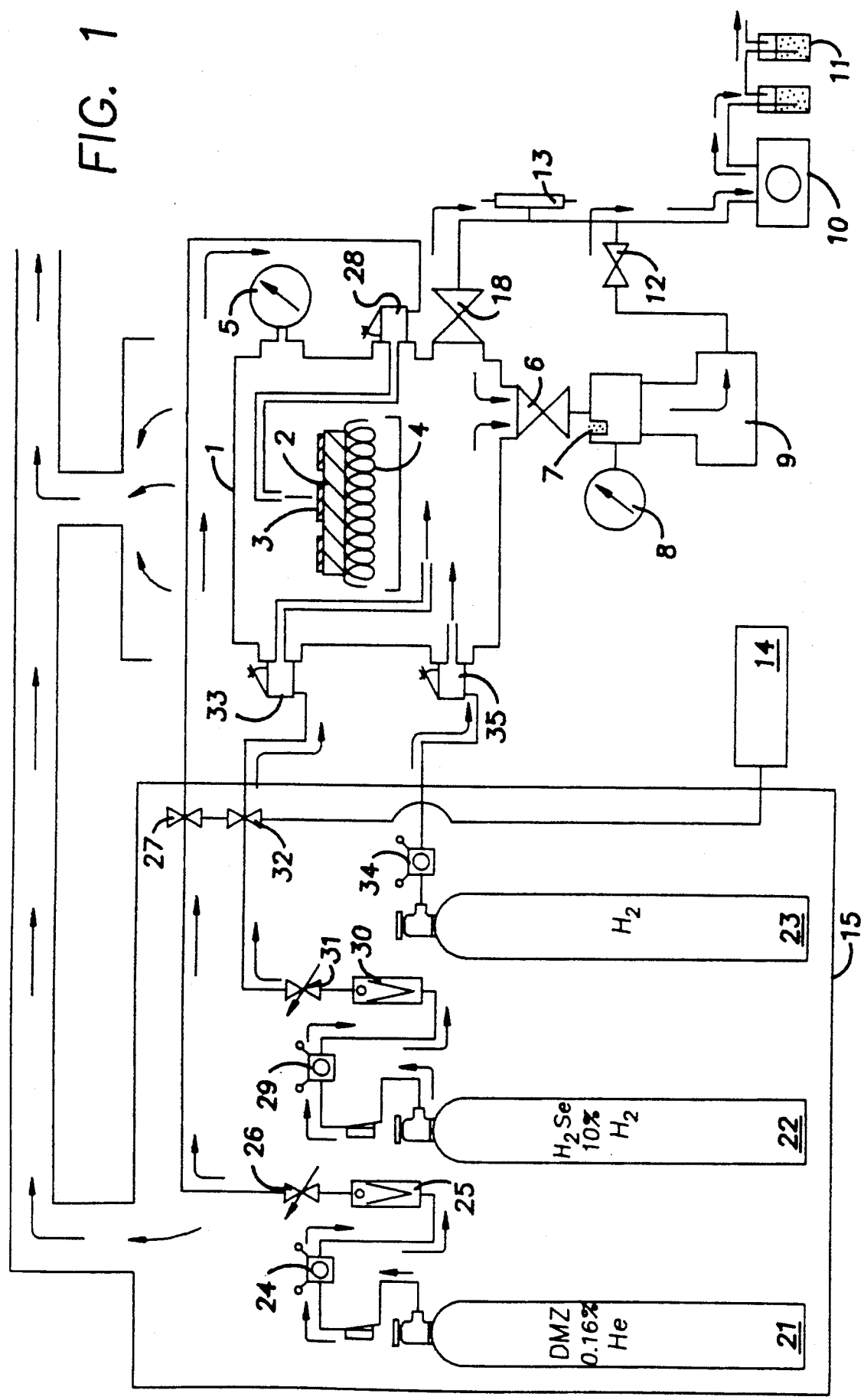
FIG. 1 schematically shows an apparatus for carrying out the MOCVD method.

The method of the present invention is characterized in the use of the ZnSe single crystal substrate and the epitaxial growth of the ZnSe thin layer thereon.

To produce the ZnSe single crystal ingot, conventionally the following methods are employed:

(1) High pressure Bridgman method
(2) High pressure Tammann method
(3) Solution growth method
(4) Sublimation method
(5) Piper method
(6) Iodine transporting method.

However, none of them can effectively produce a large ZnSe single crystal with good quality.

Since the methods (1) and (2) require high temperature and high pressure, the single crystal tends to contain impurities such as Si, C and the like. The single crystal has many defects. In addition, the produced crystal is not necessarily the single crystal.

Since ZnSe is crystallized from a saturated solution of the raw material in the method (3), only small crystal particles having irregular shapes are formed.

In the method (4), the single crystal is not necessarily formed and the polycrystal tends to be formed.

In the method (5), the sintered ZnSe mass is partially heated to sublimate ZnSe. This method tends to produce the polycrystal. Further, it is difficult to produce a large particle of the single crystal.

The method (6) utilizes the iodine atoms as a transporting agent. Although this method can produce a comparatively large single crystal, the produced single crystal contains many defects such as dislocation, stacking faults, twin crystals, etc.

Then, according to the present invention, the ZnSe single crystal for the substrate is produced by a method utilizing the traveling heater method, which is disclosed and claimed in Japanese Patent Kokai Publication No. 230599/1988 (Patent Application No. 65389/1987 filed on Mar. 18, 1987). In the method, the single crystal is not directly formed from the powder or melt raw material.

Figure 4:
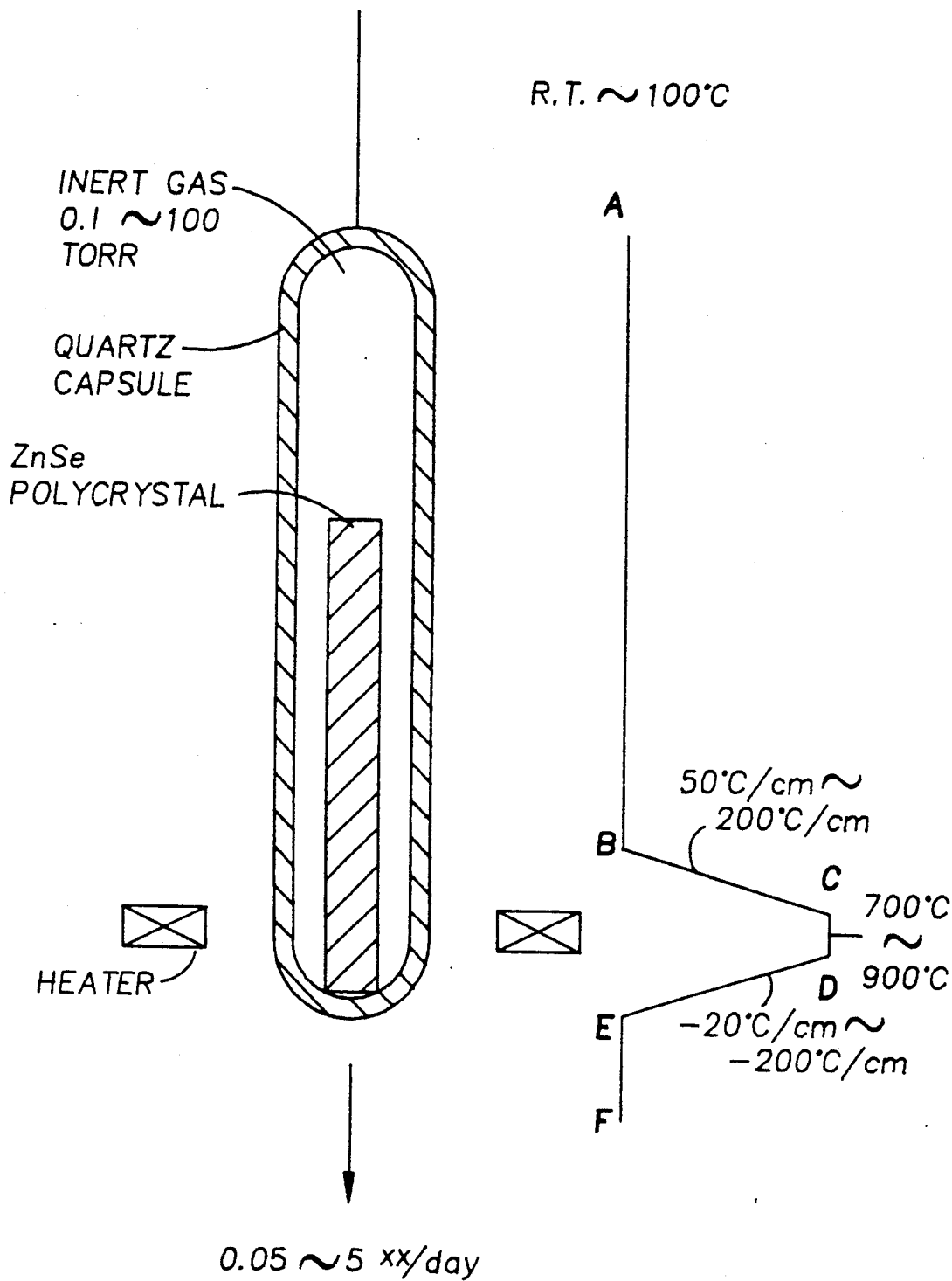

This method for producing the ZnSe single crystal will be illustrated with making reference to FIG. 4.

The ZnSe polycrystal having a suitable size can be produced by the conventional CVD or sintering method. From the polycrystal bulk, a rod is cut out to partially heat the polycrystal in the subsequent steps. For example the rod has a diameter of from 3 to 30 mm.

The polycrystal rod is placed in a reaction tube, for example a quartz capsule. Then, the tube is filled with at least one gas selected from the group consisting of an inert gas, nitrogen and $H_2Se$, and sealed. The amount of the gas is so adjusted that the inner pressure reaches 0.1 Torr. to 100 Torr. during heating. The capsule may not be sealed if the subsequent heating is carried out in the atmosphere of the above described gas.

Then, the reactor tube is heated. The temperature distribution to be achieved by a heater is schematically shown in FIG. 4 by the line A-B-C-D-E-F, although the actual temperature distribution may not be such simple shape.

A low temperature first zone corresponding to the line A-B is kept at a temperature of from room temperature to 100° C. A temperature-raising second zone corresponding to the line B-C has a temperature gradient of from 50° C./cm to 200° C./cm. A high temperature third zone corresponding to the line C-D is kept at a temperature of from 700° C. to 900° C. The length of the third zone (C-D) is made as short as possible, for example 5 mm to 20 mm. A temperature-lowering fourth zone corresponding to the line D-E has a temperature gradient of from $-200°$ C./cm to $-50°$ C./cm. Finally, a low temperature fifth zone corresponding to the line E-F is kept at a temperature of from room temperature to 100° C. The reactor tube is passed from the first zone to the fifth zone at a rate of from 0.05 mm/day to 5 mm/day while keeping the solid state of the ZnSe material. Since only the zone C-D is kept at the high temperature, the ZnSe polycrystal is converted to a ZnSe single crystal. Since temperature is not higher than 900° C. even in the high temperature third zone and the atmosphere is filled with the above gas, ZnSe is not sublimated and keeps the solid state. In FIG. 4, the zones are vertically arranged, although they may be horizontally or slantwise arranged.

Since the crystal is moved relatively to the heater, this method is a kind of the traveling heater methods. Since the polycrystal is converted to the single crystal through rotation of crystalline grains, this method is in the category of recrystallization. Then, the above method for converting the polycrystal to the single crystal can be named as "Recrystallization Traveling Heater Method (RTHM)."

From the produced ZnSe single crystal rod, a wafer as the substrate is cut out.

Then, the ZnSe thin film is epitaxially grown on the ZnSe single crystal substrate by the MOCVD method.

In addition to the use of the ZnSe substrate produced in the above, the amounts of the zinc source compound and the selenium source compound to be supplied is also the characteristic of the present invention. These compounds are supplied in the MOCVD atmosphere in such amounts that the molar ratio of Se/Zn is from 10 to 100. For example, the zinc source compound and the selenium source compound are supplied at rates of about $10^{-6}$ mol/min. and about $10^{-4}$ mol/min., respectively, although these rates vary with the volume of the MOCVD reactor.

As the zinc source, any of organozinc compounds may be used. Preferred examples of the organozinc compounds are dimethylzinc [Zn(CH$_3$)$_2$] and diethylzinc [Zn(C$_2$H$_5$)$_2$].

As the selenium source, H$_2$Se is used.

Preferably, the epitaxial growth rate of the ZnSe thin film is up to 1 μm/hour.

By making reference to FIG. 1, the MOCVD apparatus for carrying out the method of the present invention will be illustrated. In FIG. 1, the apparatus is placed horizontally, although a vertically arranged apparatus can be used in the present invention. Since the MOCVD apparatus is well known in the art, it will be briefly explained.

A CVD furnace 1 consists of a vessel which can be evacuated. In the furnace 1, a round suscepter 2 is installed. On the suscepter 2, a ZnSe substrate 3 is horizontally placed, and below the suscepter 2, a heater 4 is arranged. By the heater 4, the suscepter 2 and then the substrate 3 are heated at a desired temperature. The degree of vacuum in the furnace 1 is monitored with a vacuum gauge 5.

The furnace 1 is evacuated with a rotary pump 10 and further with an oil diffusion pump 9 through a main valve 6 and a valve 12. In an exhaust system, a trap 7 cooled with liquid nitrogen and a vacuum gauge 8 are provided. A trap 11 is used to remove the impurities and the like.

First, the furnace 1 is evacuated with the rotary pump 10 through a valve 18. The degree of vacuum during evacuating the furnace 1 with the rotary pump 10 through a valve 18 is roughly indicated by a Geissler tube 13. When the vacuum degree reaches considerably high, the valve 18 is closed and the valve 12 is opened so as to initiate the evacuation with the oil diffusion pump 9.

Cylinders 21, 22 and 23 in a box 15 contain, for example, helium gas containing 0.16% of dimethylzinc, hydrogen gas containing 10% of H$_2$Se and pure hydrogen gas, respectively.

The dimethylzinc-containing helium is supplied into the CVD furnace 1 from a gas inlet 28 through a regulator 24, a mass flow controller 25, a cutting valve 26 and an air-motor operated valve 27. The air-motor operated valve 27 or the cutting valve 26 is controlled by a computer to adequately adjust the supply amount of the dimethylzinc-containing gas. The H$_2$Se-containing hydrogen gas is supplied into the CVD furnace 1 from a gas inlet 33 through a regulator 29, a mass-flow controller 30, a cutting valve 31 and an air-motor operated valve 31.

The pure hydrogen gas is used to form a reduction atmosphere in the furnace and also to keep the pressure in the furnace at a pressure of 0.1 to 10 Torr. (10 to 1,000 Pa). The hydrogen gas is supplied in the furnace from a gas inlet 35 through a regulator 34.

As already described, the substrate temperature is adjusted at a temperature of from 250° C. to 450° C., the Se/Zn ratio is controlled to be from 10 to 100. Near the substrate surface, the raw materials react each other in the gas phase to form ZnSe which is deposited on the surface of the substrate 3.

The thickness of the ZnSe thin film can be adjusted by the reaction time. Usually, the thickness is from 0.001 to 10 μm, preferably from 0.1 to 10 μm.

PREFERRED EMBODIMENTS OF THE INVENTION

The present invention will be illustrated further in detail by following Examples.

EXAMPLE

From the ZnSe single crystal mass produced by the RTHM method, a wafer having the (110), (100) or (111) plane on the surface was cut out and etched with a boiling 25% aqueous solution of sodium hydroxide. Then, the wafer was treated in a hydrogen stream under several ten Torr. at 500° C. for several minutes to clean the surface.

As the zinc source, the helium gas containing 0.16% of dimethylzinc was used. As the selenium source, the hydrogen gas containing 10% of H$_2$Se was used.

After horizontally setting the ZnSe wafer on the suscepter, the CVD furnace was evacuate to $10^{-7}$ Torr. Thereafter, the suscepter and the substrate were heated to a temperature of from 250 to 400° C., and the helium gas was introduced in the furnace. Then, ZnSe was grown on the wafer surface under following conditions:
Substrate: ZnSe (110), (100) or (111)
Substrate temperature: 250–400° C.
Flow rate of dimethylzinc: $5.85 \times 10^{-6}$ mol/min.
Flow rate of H$_2$Se: $1.44 \times 10^{-4}$ mol/min.
Se/Zn molar ratio: 24.6:1
Total pressure: 3.0 Torr.

The produced ZnSe thin film had a thickness of about 1 μm and good morphology. The RHEED measurement confirmed that the thin film was a single crystal film.

Figure 2:
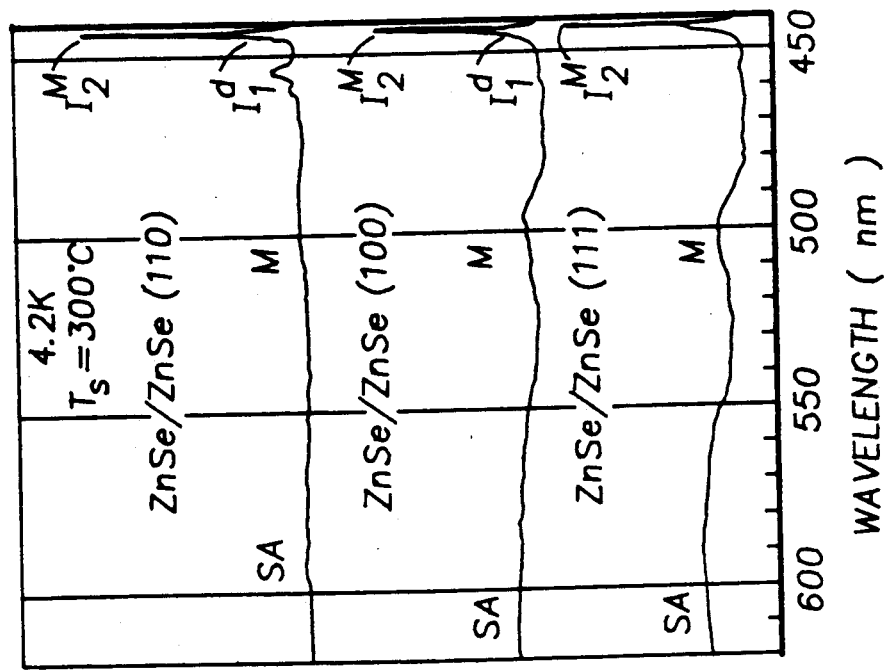
FIG. 2 is a graph showing the results of photoluminescence (4.2 K.) of the ZnSe thin layers which were grown on the (110), (100) and (111) planes of the ZnSe substrates, respectively.

The thin film was subjected to the photoluminescence measurement which comprises illuminating strong UV light on the thin film kept at 4.2 K. to excite the electrons and measuring the emitted light from the excited state. The results are shown in FIG. 2.

All the transitions which have lower energy levels than the UV light appeared. This results reflect the band structures and the impurity levels. "$T_s = 300°$ C." in FIG. 2 indicates that the epitaxial growth was carried out at the substrate temperature ($T_s$) of 300° C.

The first upper graph shows the results for the ZnSe thin film grown on the (110) plane of the ZnSe substrate. The second middle graph shows the results for the ZnSe thin film grown on the (100) plane of the ZnSe substrate. The last lower graph shows the results for the ZnSe thin film grown on the (111) plane of the ZnSe substrate. Each graph has the strong emission peak ($I_2^M$) due to the excitons constrained with the neutral donors around the wavelength of 443 nm. This emission is by far the strongest luminescence.

In case of the (110) plane, there is no other high peak, and the graph is rather smooth.

In cases of the (100) and (111) planes, weak emissions (SA, M) of the deep levels appear in a broad wavelength range.

The emission caused by the excitons constrained with the neutral donors may be a problem. Then, the kind of the neutral donor will be clarified. The $I_2^M$ peak is sharp and has a half value width of 4 to 5 meV. The peak appears at the same wavelength as the $I_2^{Al}$ peak which appears in the ZnSe bulk single crystal. Thus, the neutral donor may be assumed to be aluminum.

The following reasons may be given to this contamination with aluminum:

The aluminum atoms contained in the ZnSe bulk single crystal may diffuse in the ZnSe thin film, and aluminum may be contained in the raw material such as dimethylzinc. In addition, since the chamber wall is made of aluminum, such aluminum may be transferred into the ZnSe single crystal.

In the above points, the present invention can be distinguished from Blanconnier et al. They assumed that the iodine atoms might generate the excitons constrained with the neutral donor which appeared in the photoluminescence of the thin film epitaxially grown on the substrate produced by the iodine transporting method, and the Ga atoms might generate the excitons constrained with the neutral donors which appeared in the photoluminescence of the thin film epitaxially grown on the substrate produced by the Piper method.

Although the formation of such excitons constrained with the neutral donors cannot be avoided, temperature dependency of the formation of such excitons will make it clear that the present invention is advantageous over Blanconnier et al.

Figure 3:
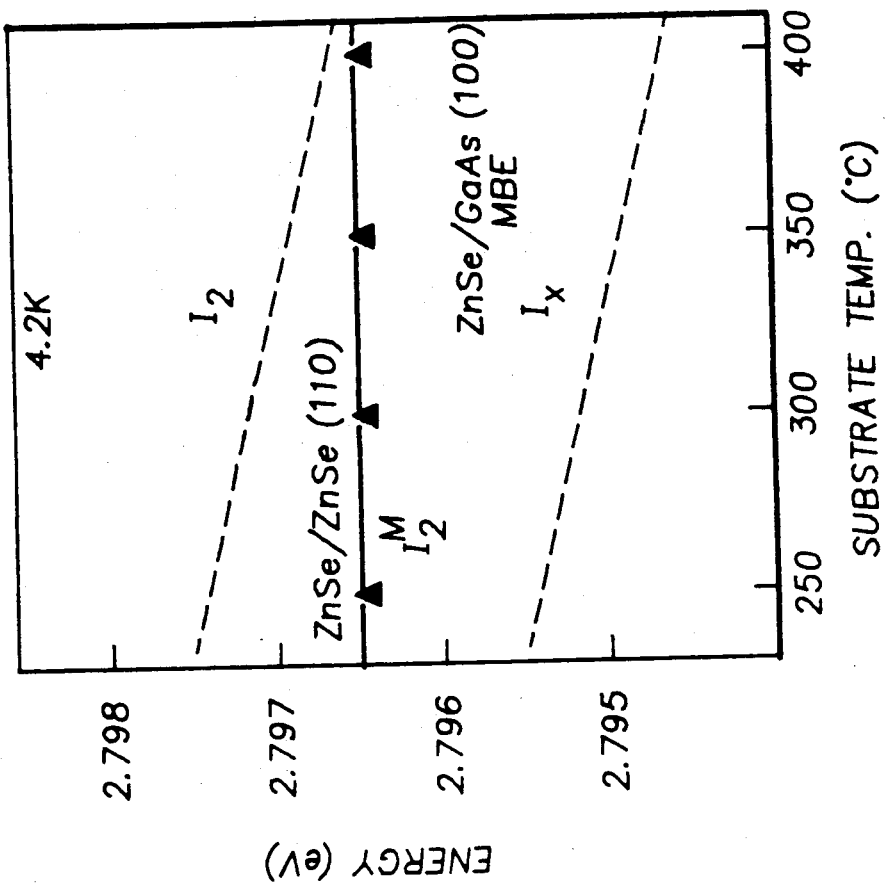
FIG. 3 is a graph showing the change of energy of the excitons constrained with the neutral donors when the ZnSe thin film was epitaxially grown on the ZnSe substrate kept in a temperature range of from 250° C. to 400° C., and FIG. 4 schematically shows the RTHM (Recrystallization Traveling Heater Method) for producing the ZnSe single crystal bulk.

FIG. 3 shows the change of energy of the excitons constrained with the neutral donors when the ZnSe thin film was epitaxially grown on the ZnSe substrate kept at a temperature in the range from 250° C. to 400° C. The energy of the excitons was measured through photoluminescence at 4.2 K. As understood from this graph, the good epitaxial ZnSe film was produced at any temperature in the above range. As indicated by the solid line, the energy of $I_2^M$ was substantially constant at 2.7965 eV.

For comparison, ZnSe was epitaxially grown on the GaAs substrate by the molecular beam epitaxy (MBE) method.

The energy of $I_2$ (the excitons constrained with the neutral donors) and $I_x$ in the photoluminescence of the grown ZnSe thin film was measured. In this film, the energy decreases as the substrate temperature raises. In the heteroepitaxy of ZnSe on GaAs, the energy of $I_2$ and $I_x$ depends on the substrate temperature on which the ZnSe film is grown.

On the contrary, the energy of $I_2^M$ remains substantially unchanged in the homoepitaxy of ZnSe on ZnSe even if the substrate temperature changes.

These results indicate the following:

Either in homoepitaxy or in heteroepitaxy, the grown film shrinks when it is cooled to room temperature from high temperature at which the film has been grown. Further, the film is cooled to 4.2 K. at which the photoluminescence is measured. Then, the film further shrinks. In case of the homoepitaxy of ZnSe on ZnSe, since the film and the substrate are made of the same material and have the same structure, substantially no thermal stress is generated when they are subjected to the great temperature change of hundreds degrees, while in case of the heteroepitaxy of ZnSe on GaAs, large thermal stress is generated in the ZnSe thin film when they are subjected to such great temperature change. The thermal stress would change the energy of the excitons constrained with the neutral donors. This is because the temperature difference varies when the grown film is cooled to 4.2 K. at which the photoluminescence is measured, since the ZnSe thin film is grown on the substrate kept at the different temperature.

The fact that, in the homoepitaxy according to the present invention, the $I_2^M$ energy does not depend on the substrate temperature indicates that no strong stress is generated in the thin film. This means that the ZnSe thin film has long life and high resistance to thermal shock.

According to the present invention, the ZnSe thin film is formed by epitaxially growing ZnSe on the ZnSe substrate. Thereby, the formed ZnSe thin film does not suffer from mismatching of the lattice constant, thermal strain due to the difference of the coefficients of thermal expansion between the thin film and the substrate or diffusion of the impurities.

Since the large area ZnSe single crystal with less impurity which is made by the RTHM method is used as the substrate, the ZnSe single crystal thin film has good quality.

Although the ZnSe thin film is grown by the MOCVD method, the substrate temperature is comparatively low, for example, from 250° C. to 400° C., while the substrate temperature in Blanconnier et al was 500° C.

Since ZnSe is easily sublimated, it is better to carry out the epitaxial growth at a temperature as low as possible. If ZnSe is sublimated at high temperature, the surface of the thin film may be roughened. In addition, the ZnSe thin film grown at lower temperature has less thermal strain.

The ZnSe thin film grown according to the present invention contains no impurities such as the iodine or gallium atoms.

What is claimed is:

1. A method for growing a ZnSe thin film on a ZnSe single crystal substrate, comprising the steps of:
    (a) placing a portion of a ZnSe polycrystal in a sealed reactor tube containing at least one gas selected form the group consisting of an inert gas, nitrogen and $H_2Se$ at a pressure of 0.1 Torr. to 100 Torr.,
    (b) moving the reactor tube containing the ZnSe polycrystal through
        (i) a low temperature first zone maintained at a temperature from room temperature to 100° C.,
        (ii) a temperature-raising second zone having a temperature gradient from 50° C./cm to 200° C./cm,
        (iii) a high temperature third zone maintained at a temperature from 700° C. to 900° C.,
    wherein the temperature of the temperature raising second zone does not exceed the temperature of the high temperature third zone,
        (iv) a temperature-lowering fourth zone having a temperature gradient from -31 200° C./cm to −50° C./cm and
        (v) a low temperature fifth zone at a temperature from room temperature to 100° C. in this order at a rate of 0.05 mm/day to 5 mm/day while maintaining the solid state of the ZnSe crystal wherein ZnSe polycrystal is converted to ZnSe single crystal,
    (c) cutting the ZnSe single crystal to form a ZnSe single crystal substrate,
    (d) heating the ZnSe single crystal substrate in a hydrogen atmosphere under a pressure from 0.1 Torr. to 10 Torr. at a temperature from 250° C. to 450° C. while introducing a gaseous organozinc compound and $H_2Se$ gas in such amounts that a molar ration of Se/Zn is from 10 to 100 to grow the ZnSe thin film on the surface of the ZnSe single crystal substrate.

2. The method according to claim 1, wherein the gaseous organozinc compound is at least one compound selected from the group consisting of trimethylzinc and triethylzinc.

3. The method according to claim 1, wherein the organozinc compound is diluted with an inert gas.

4. The method according to claim 1, wherein $H_2Se$ is diluted with an inert gas.

5. The method according to claim 1, wherein the ZnSe single crystal substrate has a (110), (100) or (111) plane on its surface.

6. The method according to claim 1, wherein the ZnSe single crystal substrate is heated at a temperature of 250° C. to 400° C.

* * * * *

UNITED STATES PATENT AND TRADEMARK OFFICE
CERTIFICATE OF CORRECTION

PATENT NO. : 5,015,327

DATED : May 14, 1991

INVENTOR(S) : Tsunemasa Taguchi, Hirokuni Nanba

It is certified that error appears in the above-identified patent and that said Letters Patent is hereby corrected as shown below:

On the title page:

Please Change : second Assignee

"(73) Assignees: Production Engineering Association of Shin-Osaka"

to

--(73) Assignees: Production Engineering Association--

Signed and Sealed this

Fifth Day of January, 1993

*Attest:*

DOUGLAS B. COMER

*Attesting Officer* — *Acting Commissioner of Patents and Trademarks*